United States Patent
Adam et al.

[11] Patent Number: 6,139,706
[45] Date of Patent: Oct. 31, 2000

[54] SPUTTER CATHODE

[75] Inventors: Rolf Adam, Hanau; Jörg Krempel-Hesse, Eckartsborn; Martin Bähr, Haundorf-Gräfensteinberg, all of Germany

[73] Assignee: Leybold Systems GmbH, Hanau, Germany

[21] Appl. No.: 09/207,413

[22] Filed: Dec. 8, 1998

[30] Foreign Application Priority Data

Dec. 11, 1997 [DE] Germany ............... 197 54 986

[51] Int. Cl.$^7$ ................................ C23C 14/34
[52] U.S. Cl. ................ 204/298.16; 204/298.17; 204/298.19
[58] Field of Search ............... 204/298.16, 298.17, 204/298.19, 298.21

[56] References Cited

U.S. PATENT DOCUMENTS

| | | | |
|---|---|---|---|
| 4,405,436 | 9/1983 | Kobayashi et al. | 204/298.16 |
| 4,525,262 | 6/1985 | Class et al. | 204/192.12 |
| 4,572,021 | 2/1986 | Aichert et al. | 204/298 |
| 4,865,708 | 9/1989 | Welty | 204/192.12 |
| 4,964,968 | 10/1990 | Arita | 204/298.19 |
| 5,415,754 | 5/1995 | Manley | 204/132.12 |

FOREIGN PATENT DOCUMENTS

| | | |
|---|---|---|
| 196 14 487 | 10/1997 | Germany . |
| 196 17 057 | 11/1997 | Germany . |
| 196 22 606 | 12/1997 | Germany . |
| 196 22 607 | 12/1997 | Germany . |
| WO 95/12003 | 5/1995 | WIPO . |

*Primary Examiner*—Carol Chaney
*Assistant Examiner*—Julian A. Mercado
*Attorney, Agent, or Firm*—Smith Gambrell & Russell, LLP

[57] ABSTRACT

In a sputter cathode with a plate-shaped target (8) and with a trough-shaped yoke (3), arranged behind the target (8), with middle web (5) and with magnets (7, 7', . . . ) for producing a closed tunnel of field lines (15, 15', . . . ) curved in an arc in front of the target surface as well as with three sheet-metal blanks (9, 10, 11) consisting of one layer of a compound plate e.g. of an aluminum/iron compound plate, which blanks are placed into the plane between the target (8) and the front surfaces (12, 13) of the trough edge of the yoke (3), which front surfaces face the target (8), all sheet-metal blanks (9, 10, 11) of magnetically conductive material together form gaps (a, a') extending approximately parallel to the front surfaces (12, 13), which gaps (a, a') are filled out between the sheet-metal blanks (9, 10, 11) by the other layer (21) of the compound plate.

8 Claims, 2 Drawing Sheets

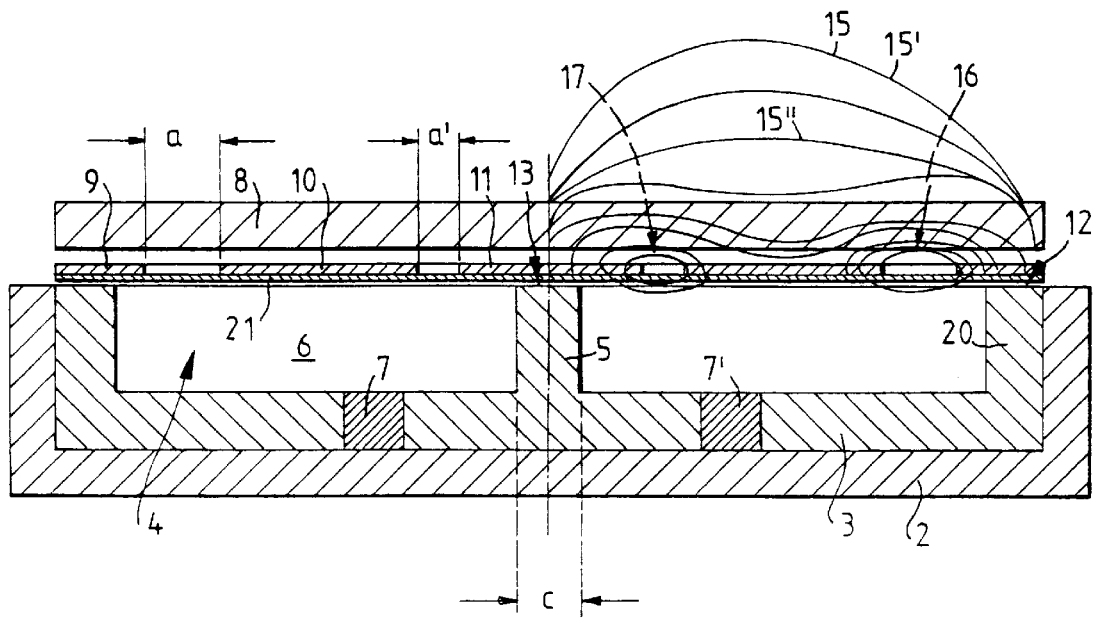
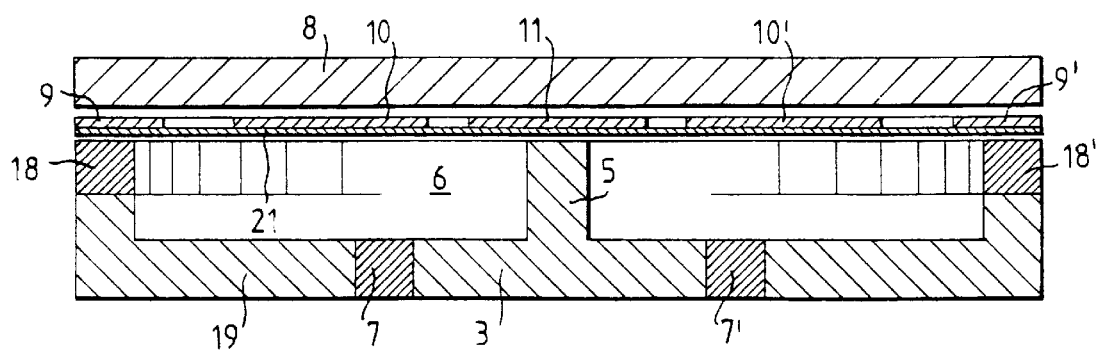

SPUTTER CATHODE

INTRODUCTION AND BACKGROUND

The present invention relates to a sputter cathode with a flat, plate-shaped target formed from at least one part and with a trough-shaped yoke arranged behind the target with a middle web or bridge and with magnets for generating closed tunnels of electric field or flux lines curved in an arc in front of the target surface. Approximately strip-shaped or annular blanks of magnetically conducting sheet metal are placed in the plane between the target and the front surface of the trough edge of the yoke, which front surface faces the target, and with blanks covering the area above the front surface of the trough edge and of the middle web and with further blanks covering a part of the area between the front surface of the middle web and the front surface of the trough edge and with all sheet-metal sections together forming gaps extending approximately parallel to the front surfaces.

A sputter cathode of the type in question is known (U.S. Pat. No. 4,865,708) in which segments of permeable material are arranged between the target on the one hand and the magnetic yoke on the other hand in the plane of the magnet rows, namely, below the plane of the front magnet surfaces facing the target in order to concavely deflect the tunnel of curved field lines forming in front of the target in order to make possible in this manner a wider erosion trough on the target and therewith a higher target service life.

Furthermore, a sputter cathode has been suggested (DE 196 22 606.6) with a base cathode body with a plate-shaped target as well as with a magnet yoke arranged behind the target and with two closed series of magnets with different polarities arranged in an oval or rectangular configuration and coaxially to each other in a plane parallel to the target plane. Sheet-metal blanks or appropriately configured partial blanks of magnetically conductive material are placed in the plane between the target and the front surfaces of the magnets facing the target. Two of the sheet-metal blanks or partial blanks have a frame-shaped configuration. The two arced sections of the sheet-metal blanks uniting straight longitudinal parts to each other have an edge course deviating from a circular arc, e.g. an elliptical, parabolic or even irregularly arced edge course so that the gap formed by two adjacent, arced sections has an irregular course of width.

In addition, a sputter cathode has been suggested (DE 196 22 607.4) with a magnet yoke arranged behind the target with two rows of magnets arranged in oval or in rectangular configuration and coaxially to each other in a plane parallel to the target plane with the magnets three sheet-metal blanks or groups of partial blanks placed into the plane between the target and the front surfaces of the magnets facing the target. Two of these sheet-metal blanks or partial blank groups cover the area above the magnets and the third sheet-metal section or the third group covers a part of the area between the magnet rows and all sheet-metal blanks together form two gaps extending approximately parallel to the magnet rows.

An object of the present invention is to arrange the magnets and the segments in such a manner that on the one hand a flat and especially wide erosion trough forms during the sputtering operation, the most optimum target removal of metal occurs and that on the other hand the area between the two parallel magnet tunnels forms as narrowly as possible.

In addition, the segments should be formed in such a manner that they can be manufactured as economically as possible and that their rigidity is dimensioned in such a manner that they can be installed into the cathode without further supporting or holding means.

SUMMARY OF THE INVENTION

The above and other objects of the invention can be achieved if the blanks of magnetically conductive material are cut out of one layer of a dual-layer sheet laminate consisting of a suitable metal alloy, as for example, an aluminum/iron compound plate. The other layer is formed by magnetically non-conductive material and bridges the gaps between the blanks of magnetically conductive material as well as stiffens the blanks.

Thus, the present invention features a sputter cathode composed of at least one part that is a flat, plate-shaped target and with a trough-shaped yoke arranged spaced apart; e.g., behind the target with a middle web or bridge and with a plurality of magnets for generating closed tunnels of electric field lines that curve in an arc in front of the target surface. There are also a plurality of generally strip-shaped or annular blanks of magnetically conducting sheet metal placed in the plane between the target and a front surface of the trough edge of the yoke. The front surface faces the target and a portion of the blanks cover the area above the front surface of the trough edge and of the middle web. Further blanks cover a part of the area between the front surface of the middle web and the front surface of the trough edge. All of the strip shaped or annular blanks together form gaps extending approximately parallel to the front surfaces. The plurality of magnets are included or inserted into the yoke bottom and/or the trough edge or middle web and the blanks of magnetically conductive material are cut out of the one layer of a dual-layer sheet laminate consisting e.g. of an aluminum/iron compound plate. The other layer of the dual layer laminate is formed by magnetically non-conductive material and bridges the gaps between the blanks as well as stiffens the blanks.

BRIEF DESCRIPTION OF THE DRAWINGS

The invention allows very many possible embodiments, and will be further understood from the accompanying drawings illustrating certain embodiments in detail in a purely schematic fashion:

FIG. 2 is a sectional view through the cathode of FIG. 1 in which a row of magnets is positioned into the bottom of the trough-shaped yoke; and FIG. 3 is a sectional view through a cathode in which, in contrast to the embodiment of FIGS. 1 and 2, additional magnets are arranged on the trough edge.

DETAILED DESCRIPTION OF THE INVENTION

Figure 1:
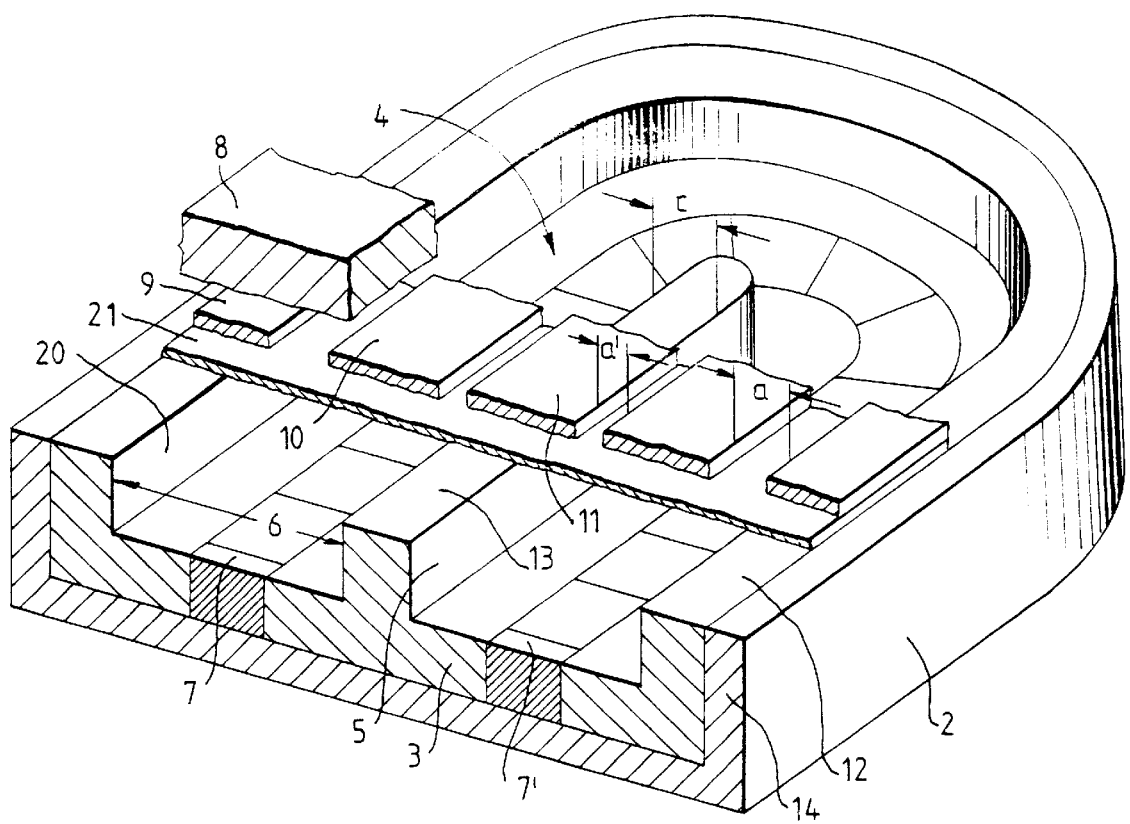
FIG. 1 is a partial perspective view of one half of a cathode with the target and the sheet-metal blanks shown only as fragments.

The sputter cathode according to FIGS. 1 and 2 comprises a trough-shaped base cathode body 2 into which a likewise trough-shaped yoke 3 is inserted. The yoke 3 comprises a web 5 dividing recess 4 in the yoke in the longitudinal direction, the length of which web is dimensioned in such a manner that an oval cooling conduit 6 with a rectangular cross-sectional surface is formed. A closed series of cube-shaped permanent magnets 7, 7′, . . . are inserted into the bottom part of the yoke 3 in such a manner that their side surfaces facing and turned away from target 8 arranged above yoke 3 are flush with the bottom surface of recess 4 and the back surface of yoke 3. Three sheet blanks 9, 10, 11 are inserted between target 8 and yoke 3, of which blanks the two blanks 9 and 10 are provided concentrically to one another and are designed as oval rings. The middle blank is a strip-shaped blank 11 surrounded by the annular blanks 9, 10. The blanks 9, 10, 11 consist of magnetically conductive material and are electroplated onto a sheet of magnetically non-conductive material or are fabricated from one layer of a sheet-metal laminate or of a dual-layer sheet, in which instance the second sheet layer of magnetic material remains unmachined.

Target 8 is arranged above magnetic yoke 3 with its closed series of magnets 7, 7', . . . The target is customarily provided on its bottom which faces the magnets with a permanent target base plate (not shown in detail).

The three sheet-metal blanks 9, 10, 11 enclose two gaps a and a' between themselves which can be dimensioned to be equally wide over their entire length or can be designed in a tapering or widened manner. Field lines 15, 15', . . . are deflected more or less strongly as a function of the gap width a or a' so that a closed tunnel of field lines 15, 15', . . . is formed which is flattened and thus on the whole compensates the sputtering rate and also improves the target utilization.

Standard magnetron cathodes consisting of a simple magnetic arrangement (two rows of magnets with opposed polarity) generally produce in their target a tapered sputtering trough. This trough as a rule becomes narrower, the deeper it becomes. An advantage of the invention is that a magnet field is formed which is different above the target surface and in the target. The field above the target surface corresponds to that of the standard magnetron cathodes. It runs approximately parallel to the target surface and enters and exits on the two sides of the target. A so-called roof field is generated.

In contrast to traditional cathodes without sheets inserted between the target and yoke, a field consisting of at least two such roof fields 16, 17 is generated in target 8 in the case of the embodiment of the invention. As a result thereof, the plasma is divided on the target surface into several adjacent partial plasmas, strengthened by which, no longer the middle area of each target half but rather their edge areas are worn, which results in a significant increase of the target utilization since the sputtering trough becomes comparatively wider therewith.

During the construction of a sputter cathode of this type, greater magnetic excitations are required than in the case of traditionally constructed sputter cathodes since a greater portion of the magnetic flux is conducted in the yoke and the sheets and therefore not over the target surface. The entire magnetic flux density must therefore be increased.

When the required magnets are positioned inside and outside (that is, on the web and on the trough edge), the available space for the magnets is limited by the outside diameter (installation dimension) as a rule. Only a limited volume can be used for the installation of the necessary magnet masses—depending on the geometric conditions. Since the magnetic field distribution is significantly defined by the field discharge at gaps a, a' when using the principle in question, the actual position of the magnets is, however, relatively unimportant. It is therewith possible to integrate the magnets into the bottom of magnetic yoke 3 without greatly changing the relative field course. There is a comparatively great amount of space available in the bottom of yoke 3 for the installation of magnets. Magnets 7, 7', . . . are therefore installed horizontally into the yoke bottom.

Since no magnets are necessary in particular on edge 12 of trough-shaped yoke 3 and on middle web 5 in the cathode in accordance with the present invention, these areas can be designed to be especially narrow, which results in better target utilization.

A further increasing of the magnet masses can be produced by the combination of magnets which are integrated horizontally as well as vertically in the yoke and/or are placed on it (see FIG. 3). In addition to the horizontal magnets installed in the bottom, the magnets 18, 18', . . . are placed on the circumferential edge of yoke trough 19.

A dual-layer sheet or sheet laminate is advantageously used for the production of sheet-metal blanks 9, 10, 11, in which sheet laminate the one layer consists of iron and the other layer of copper, which two sheets are permanently pressed to one another, welded, cast or rolled (plated) onto each other.

The layer of iron is purposefully milled off from the copper layer 12 so that blank 9, 10, 11, 21 shown in FIG. 1 is produced which is inherently stiff, assures the accuracy of the size of gaps a, a', . . . and can be readily installed into the cathode.

Further varations and modifications of the foregoing will be apparent to those skilled in the art and are intended to be encompassed by the claims appended hereto.

German priority application 197 54 986.1 is relied on and incorporated herein by reference.

We claim:

1. A sputter cathode comprising a flat, plate-shaped target formed from at least one part and with a trough-shaped yoke arranged spaced apart from the target with a middle web and with a plurality of magnets for generating closed tunnels of field lines curved in an arc in front of the target surface, a plurality of strip-shaped or annular blanks of magnetically conducting sheet metal placed in the plane between the target and a front surface of a trough edge of the yoke, which front surface faces the target, and with a portion of said blanks covering the area above the front surface of the trough edge and of the middle web and with further blanks covering a part of the area between the front surface of the middle web and the front surface of the trough edge, all sheet-metal blanks together forming gaps extending approximately parallel to the front surfaces, wherein said plurality of magnets are inserted into the yoke bottom and/or the trough edge or middle web and wherein said plurality of blanks are formed of magnetically conductive material cut out of one layer of a dual-layer metal sheet laminate and a second layer of said laminate is formed of magnetically non-conductive material and bridges the gaps between the plurality of blanks and stiffens the blanks.

2. The sputter cathode according to claim 1 wherein said one layer of said dual layer metal sheet laminate comprises aluminum and iron.

3. The sputter cathode according to claim 1 wherein said one layer of said dual layer metal sheet laminate comprises copper.

4. The sputter cathode according to claim 1 wherein said one layer of said dual layer metal sheet laminate comprises non-magnetic material.

5. The sputter cathode according to claim 1 wherein said one layer of said dual layer metal sheet laminate comprises magnetic material.

6. The sputter cathode according to claim 1 wherein said second layer of said dual layer metal sheet laminate comprises copper.

7. The sputter cathode according to claim 1 wherein said second layer of said dual layer metal sheet laminate comprises magnetic material.

8. The sputter cathode according to claim 1 wherein said second layer of said dual layer metal sheet laminate comprises non-magnetic material.

* * * * *